United States Patent [19]

Frech et al.

[11] 4,352,160
[45] Sep. 28, 1982

[54] STATISTICAL METHOD OF MEASURING THE DIFFERENTIAL LINEARITY OF AN ANALOG/DIGITAL CONVERTER USING A PSEUDO-RANDOM TRIANGLE WAVE STIMULUS

[75] Inventors: John W. Frech, Baltimore, Md.; Lonnie C. Au, Fort Wayne, Ind.

[73] Assignee: The United States of America as represented by the Secretary of the Air Force, Washington, D.C.

[21] Appl. No.: 113,890

[22] Filed: Jan. 21, 1980

[51] Int. Cl.$^3$ .................. G06F 15/20; G01R 15/12
[52] U.S. Cl. .............................. 364/553; 324/73 R; 340/347 R; 340/347 M
[58] Field of Search .... 340/347 M, 347 AD, 347 CC, 340/347 SH; 324/73, 121 R; 328/151; 364/553, 554

[56] References Cited

U.S. PATENT DOCUMENTS

| | | | |
|---|---|---|---|
| 3,497,684 | 2/1970 | McKiernan | 364/554 |
| 4,020,286 | 4/1977 | Ceci | 179/1 SA |
| 4,082,218 | 4/1978 | Paulinski | 371/4 |
| 4,139,895 | 2/1979 | Kurkjian | 364/802 |
| 4,142,146 | 2/1979 | Schumann et al. | 324/121 R X |

OTHER PUBLICATIONS

Burton, Checking A/D Converter Linearity, Analog Dialogue 13-2, 1979.
Havener, Catch Missing Codes in A/D Converters . . . , Electronic Design 16, Aug. 2, 1975, pp. 58-64.
The Engineering Staff of Analog Devices, Inc., 6/1972, Analog-Digital Conversion Handbook, pp. II-94 to II-105; II-122 to II-127; II-128.
Clark, D/A Conversion with Single-Supply Circuit, Analog Dialogue 10-1 (1976) (Single Sheet).
Downing et al., A Method for the Assessment of the Performance . . . , Electronic Letters, Apr. 13, 1978, Vol. 14, No. 8, pp. 238-240.

Primary Examiner—Thomas J. Sloyan
Attorney, Agent, or Firm—Donald J. Singer; Willard R. Matthews

[57] ABSTRACT

The differential linearity of an analog-digital converter is measured by a test method that eliminates the need for precision calibrated test equipment. A triangle waveform with a pseudo random period is applied to the analog/digital converter input. The waveform has a uniform amplitude probability density function. Therefore, any analog/digital converter input voltage has an equal chance of being sampled by the analog/digital converter. The number of times each possible analog/digital converter output code word occurs is counted by a microprocessor. These numbers are a direct measure of differential linearity with an accuracy described by the theory of repeated random sampling.

1 Claim, 10 Drawing Figures

FIG. 4
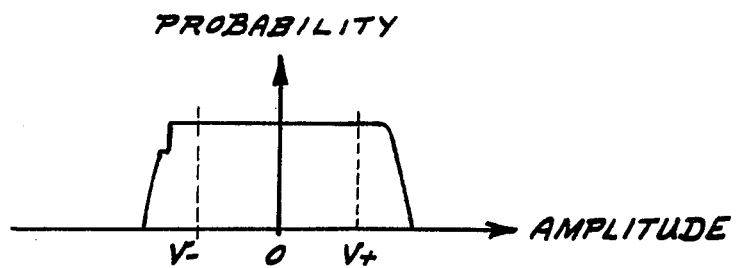
FIG. 5-a
FIG. 5-b
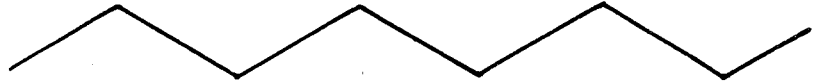
FIG. 5-c
FIG. 5-d
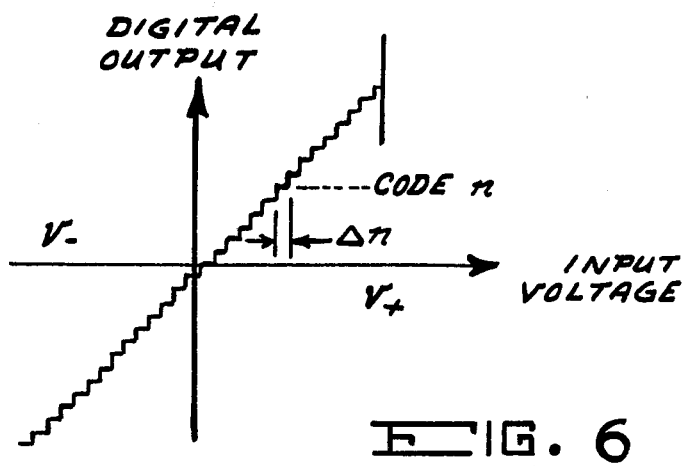
FIG. 6

STATISTICAL METHOD OF MEASURING THE DIFFERENTIAL LINEARITY OF AN ANALOG/DIGITAL CONVERTER USING A PSEUDO-RANDOM TRIANGLE WAVE STIMULUS

STATEMENT OF GOVERNMENT INTEREST

The invention described herein may be manufactured and used by or for the Government for governmental purposes without the payment of any royalty thereon.

BACKGROUND OF THE INVENTION

This invention relates to analog/digital converters and in particular to a method for statistically measuring the differential linearity of such devices.

There currently exists a variety of methods for measuring the differential linearity of an analog/digital converter. One method is to apply a known function such as a slow ramp to the input of the analog/digital converter, convert the analog/digital converter output back to the analog with a digital/analog converter and subtract it from the input. The difference from the subtractor is a series of ramps. If the digital/analog converter used in the conversion from digital to analog is perfect, the amplitudes of the ramps provide a measure of the differential linearity. This method requires a very good digital/analog converter in the test equipment.

A second method applies a "DC" voltage to the input of the analog/digital converter. The output of the analog/digital converter is examined. The "DC" input is varied slightly until the analog/digital converter output word changes between two adjacent output words. The "DC" input voltage is measured with an accurate digital voltmeter and is the DC threshold of an output word. The "DC" is changed to find the threshold of the next output word and so on until all thresholds are measured.

The two above methods require precision equipment. The first requires a precision digital/analog converter. The second requires a high precision fast reading digital voltmeter.

The need for a different approach to measurement becomes necessary when it is required to measure the differential linearity of an analog/digital converter which has "correction loops" that constantly change the offset of the analog/digital converter under test. Although the details of the analog/digital converter design are unimportant, a significant point to consider is that the "threshold method" of measurement described above is colored by the correction loop activity. The other method of measurement (re-conversion and subtraction) is subjective in that it requires a trained eye to interpret the amplitudes of the ramps.

The foregoing and other state-of-the-art approaches to measuring the differential linearity of analog/digital converters indicate the need for a new method of providing accurate linearity measurements of analog/digital converter that can be implemented without the requisite of precision calibrated equipment and/or the subjective interpretation of data. It is also desirable that the measurements be immune to noise on the input waveform and to DC drifts in the analog/digital converter. The present invention is directed toward satisfying that need.

SUMMARY OF THE INVENTION

The invention comprehends a statistical method of measuring the differential linearity of an analog/digital converter. A triangle waveform stimulus signal having a uniform amplitude probability density function is applied to the converter input. The stimulus signal has a pseudo random periodicity and its repeat period is substantially longer than the test period of the analog/digital converter being tested. The number of output codes for each coded converter transfer characteristic step are counted (by a microprocessor, minicomputer or the like) and each step size is determined as being a function of the number of time its code word occurs. Output data can be printed out as: (a) a list of all transfer characteristic step sizes; (b) step sizes that fall within discrete analog/digital converter step size windows; or (c) DC locations for all values within any analog/digital converter step size window. Measurements are demonstrated to be accurate to $+10\%$ with a probability of better than $99.9\%$ for practical applications and with even greater accuracy when a limited portion of the analog/digital converter transfer characteristic is measured.

It is a principal object of the invention to provide a new and improved method of measuring the differential linearity of an analog/digital converter.

It is another object of the invention to provide a method of measuring the differential linearity of an analog/digital converter that does not require precision calibrated equipment.

It is another object of the invention to provide a method of measuring the differential linearity of an analog/digital converter that does not require subjective interpretation of data.

It is another object of the invention to provide a method of measuring the differential linearity of an analog/digital converter whereby virtually any desired degree of accuracy can be measured.

It is another object of the invention to provide a method of measuring the differential linearity of an analog/digital converter whereby the measurements are immune to noise on the input waveform and to DC drifts in the converter.

It is another object of the invention to provide a method of measuring the differential linearity of an analog/digital converter whereby the measurements are printed out as number of occurrences of various step sizes; step sizes that fall within discrete windows; and, as DC locations for values within any step size window.

These together with other objects, features and advantages of the invention will become more readily apparent from the following detailed description when taken in conjunction with the illustrative embodiment in the accompanying drawings.

DESCRIPTION OF THE DRAWINGS

FIG. 4 is the amplitude probability density function of the triangle waveform of FIG. 3;

FIG. 5a, 5b, 5c and 5d illustrate triangle waveforms having various periodicities;

FIG. 6 is an analog/digital converter transfer characteristic; and

DETAILED DESCRIPTION OF THE PREFERRED EMBODIMENT

Figure 1:
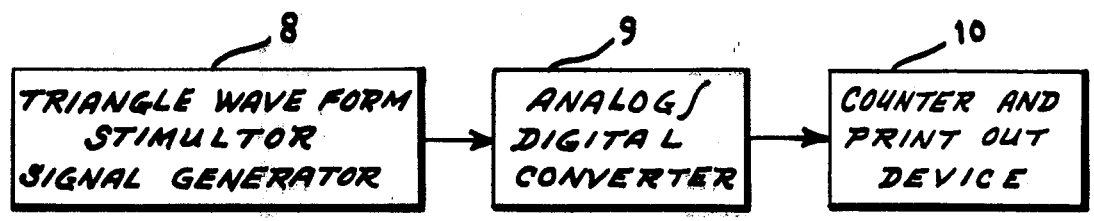
FIG. 1 is a block diagram illustrating means for implementing the method of the invention.

The differential linearity of an analog/digital converter is measured in accordance with the principles of the invention by (a) generating a pseudo random triangle waveform stimulus signal; (b) inputting the signal to the analog/digital converter to be tested; and (c) counting the number of output code words for each step of the converter transfer function. Referring to FIG. 1, triangle waveform stimulus signal generator 8, analog/digital converter 9 and converter and print out device 10 schematically illustrate means for mechanizing the invention.

The expression differential linearity refers to ratio of the $\Delta$ voltage range at the analog/digital converter input which gives any specific converter output word to the ideal quantum input. The ideal quantum input is defined as Full Scale Input Voltage/$2^n$ where n is the number of bits of the analog/digital converter. This is illustrated by the analog/digital converter transfer function of FIG. 2.

Figure 2:
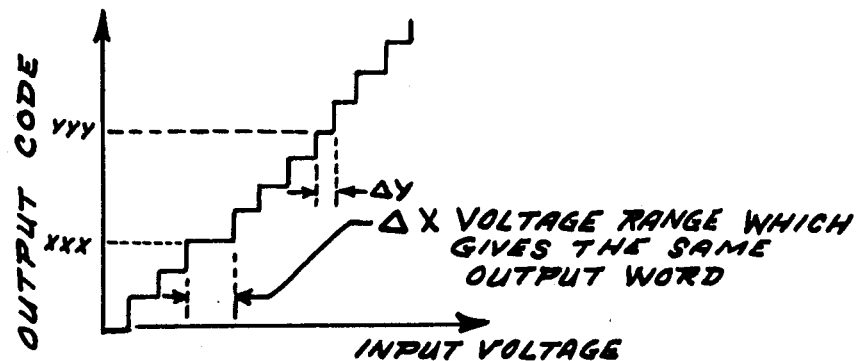
FIG. 2 illustrates a non-ideal analog/digital converter transfer characteristic.

An ideal A/D converter would have equal size $\Delta$ everywhere along the converter transfer function characteristic. In the illustration of FIG. 2 the $\Delta_X$ shown is approximately 1.5 the ideal size. This is referred to as a 1.5 quanta step at code XXX. Similarly, the $\Delta_Y$ is approximately 0.5 the ideal size and is referred to as 0.5 quanta step at code YYY.

Figure 3:
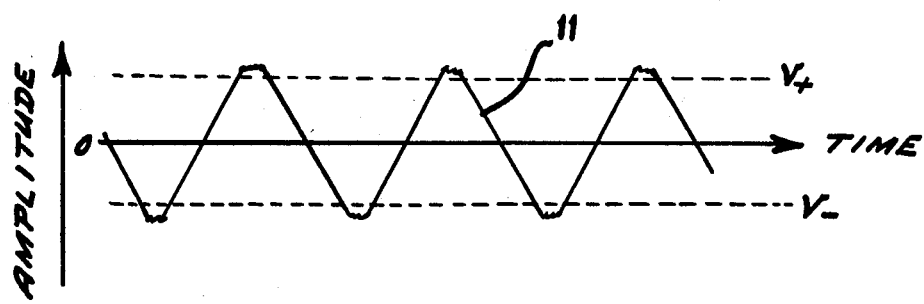
FIG. 3 is a linear triangle waveform.

In practicing the invention it is required that the stimulus signal be a triangle wave. It is relatively simple to generate a triangle waveform (such as wave 11 of FIG. 3) that is within 1% linear in the sections between V+ and V−. The frequency of such triangles can be from several hertz to above 20 MHz. (The frequencies used in one implementation of the invention were between 5 KHz and 1 MHz.) One percent (1%) is so small that it hereinafter will be considered absolutely accurate.

The amplitude probability density function of the triangle wave is shown by curve 12 of FIG. 4. It is important to note that the density function is independent of frequency or slope. That is, all of waveforms in FIGS. 5a–5d have the same density function.

The waveform of FIG. 5d is that chosen to be used as the stimulus. The period of the "triangle" is varied by varying one of the slopes. This is done with a digital pseudo random generator. The mechanization of the pseudo random triangle generator is known prior art. Next the analog/digital converter transfer characteristic of FIG. 6 is considered.

It is assumed that the total analog/digital converter input range is V+ to V−. This range is equal to the sum of all $\Delta$'s. Therefore, if the A/D converter sampled the triangle waveform at random, the probability that the input waveform lies within the voltage marked $\Delta_n$ is $$P = \frac{\Delta_n}{|V+| + |V-|}$$

For example, if an ideal 13 bit A/D was being tested, each step size should be $$\frac{|V+| + |V-|}{2^{13}} = \frac{\text{Total Input Range}}{8192}$$

and the probability that the wave falls within any $\Delta$ is 1/8192. However, if a non perfect A/D converter has a $\Delta$ twice as big as ideal, the probability is 2/8192. Therefore, it would be expected that if the A/D converter repeatability sampled the pseudo random triangle, the number of times code n came out of the A/D converter output would be twice the number of times that would show if the $\Delta$ was the proper size. In general, the number of samples expected is linearly related to the step (or $\Delta$) size.

Therefore, the size of any $\Delta$ can be determined by counting the number of times that an output code appears relative to the number of samples taken.

The following is an illustrative example of one implementation of the invention. A 13 bit A/D converter with an input range of −2.5 V to +2.5 Volts is assumed. The A/D converter outputs a flag whenever the input range is exceeded for that conversion. The conversion rate is 1.25 MHz.

A pseudo random triangle with an average frequency of 10 KHz at an amplitude of +3 to −3 volts is applied to the converter input. The 13 bit output plus overvoltage flag is inputted into a microprocessor or mini computer or some machine that will count the number of times each output code appears. This machine will monitor the flag and reject all outputs from the A/D converter for which this flag indicates overvoltage as illegitimate.

Take $2^{13} \times 1000$ legitimate samples. The microprocessor will count the total number of samples. At 1.25 MHz, the samples could be taken in 6.5 seconds; but, microprocessors are slow. The total test time is dependent on the speed of the processor and can stretch the 6.5 seconds to a much longer time.

Now, the microprocessor prints out the number of times each code appeared. For example:

| CODE | TIMES OCCURRED | THE MEASUREMENT SAYS THE STEP SIZE IS |
|---|---|---|
| . | . | . |
| . | . | . |
| . | . | . |
| 1001011100010 | 1000 | 1.000 q |
| 100101110001 | 1325 | 1.325 q |
| 1001011100000 | 892 | .892 q |
| 1001011011111 | 997 | .997 q |
| . | | |
| . | | Answers |

The accuracy of measurement of the method of the invention is described by the theory of random sampling. This theory is expounded in the text *Probability, Random Variables and Stochastic Processor*, Papalis, McGraw-Hill, 1965.

As was discussed above, the probability that the input triangle voltage is within the range $\Delta$ is $P = \Delta/2^n$ where n = The number of bits of the A/D converter being examined.

Now, if a total of S samples were taken, the most likely number of samples falling within the range of $\Delta$ is equal to $S \times \Delta/2^n$. Even though this is the most likely number of samples to fall within the range of $\Delta$, the probability that the number will be exactly $S \times \Delta/2^n$ is very low. But, the theory of random sampling states that the probability that the number of samples falling in the range of $\Delta$ is between $K_1$ and $K_2$ (for a large number of samples) is $$P[K_1 \leq K \leq K_2] = erf\sqrt{\frac{(K_2 - SP)^2}{SP_q}} - erf\sqrt{\frac{(K_1 - SP)^2}{SP_q}}$$

where
  erf=The error function.
  q=Probability that the input triangle wave is outside the range of $\Delta$.
  P=Probability that the input triangle wave is within the range of $\Delta$.
  S=Total number of samples.
In the case of a real A/D converter with $2^{13}$ steps, for example, P is one the order of $$\frac{1}{8192} \text{ or } \frac{2}{8192} \text{ or } \frac{3}{8192}$$

or some such small probability. Therefore, $$q = \frac{8191}{8192} \text{ or } \frac{8190}{8192} \text{ or } \frac{8189}{8192}$$

or some such probability $\approx 1$. The error is assuming $q=1$ is insignificant.
Manipulation of the equation shows that the probability that the measured step is accurate to within X% is $$P\% = 2\, erf\left[\sqrt{M \times \text{(Actual Step Size)}} \cdot X\%\right]$$

(Expressed as a fraction)

where M=Average number of samples per step=$S/2^n$ and X% is expressed as a fraction, i.e., for a 10% error X%=0.1. For the example given $$M = 1000 = \frac{2^{13} \times 1000}{2^{13}}.$$

The probability that the answers are correct to within 10% of the actual value are calculated below.

| MEASURED | PROBABILITY THAT THE ANSWER IS CORRECT TO WITHIN ± 10% OF THE MEASURED VALUE |
|---|---|
| 1.000 q | $2\, erf\sqrt{1000 \times 1.} \times .1 = 2\, erf(3.16) = .999+$ |
| 1.325 q | $2\, erf\sqrt{1000 \times 1.325} \times .1 = 2\, erf(3.64) = .999+$ |
| .892 q | $2\, erf\sqrt{1000 \times .892} \times .1 = 2\, erf(2.99) = .999+$ |
| .997 q | $2\, erf\sqrt{1000 \times .997} \times .1 = 2\, erf(3.16) = .999+$ |

This shows that the measurements are accurate to +10% with a probability of better than 99.9% for the example given.

Figure 7:
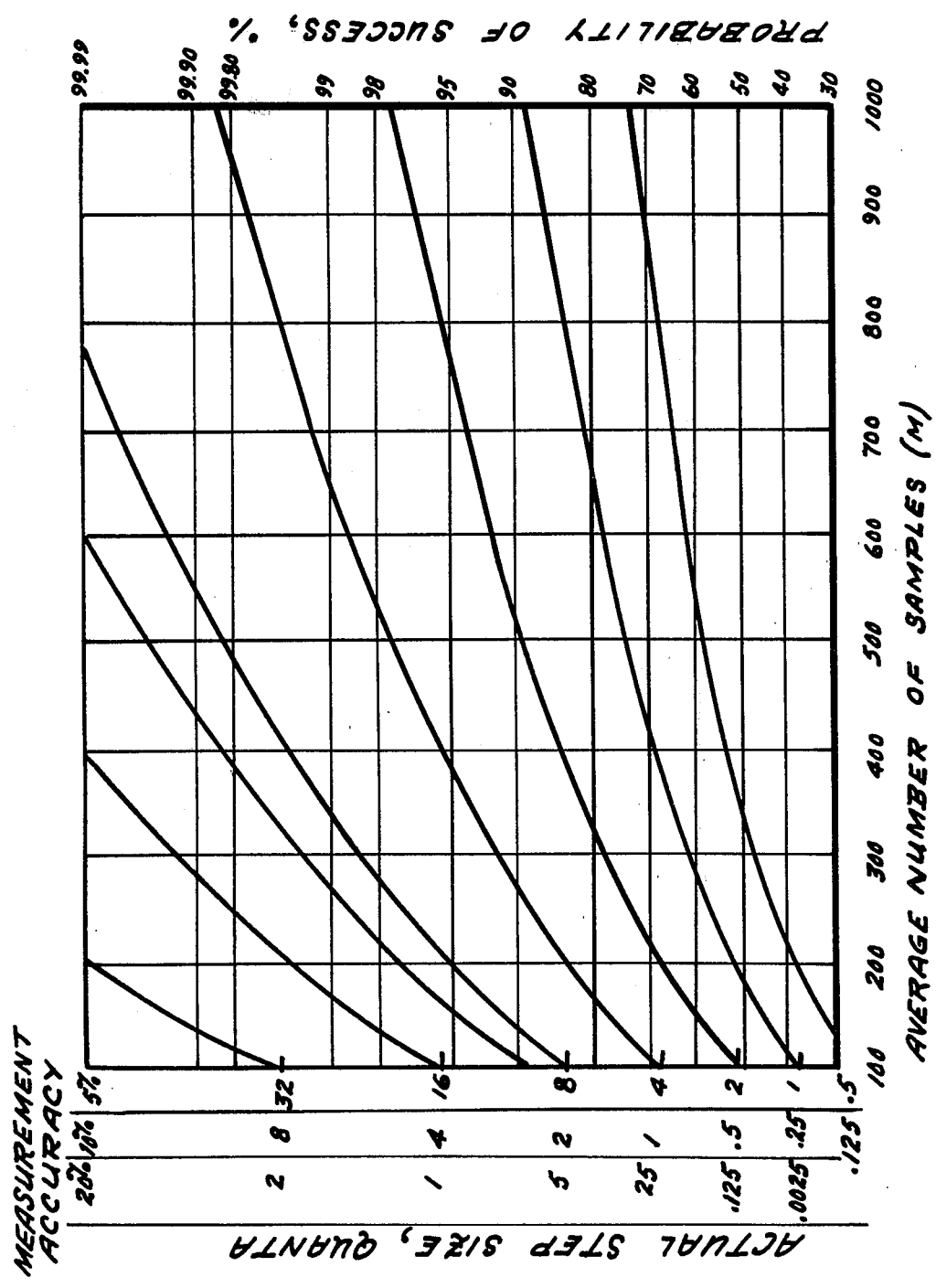
FIG. 7 is a graph illustrating probability of success of measuring various analog/digital transfer characteris-

The probability of accuracy for various numbers of samples and % error are tabulated in FIG. 7. By way of example, referring to FIG. 7 it is seen that the probability that an actual step size of one quantum will be measured to an accuracy of ±20% for an average number of samples of 300=99.99%.

It might be suspected that if the triangle wave stimulus were without a pseudo random period change, the A/D converter sampling may be in some undesirable timing relation to the triangle. For example, if the triangle was running at a 1.25 MHz and the A/D was sampling at a 1.25 MHz rate, all points along the A/D would not be equally sampled. This problem can be solved by setting the triangle frequency at a value which would not allow this to happen. There are many frequency ranges which are compatible with the number of samples taken and the sampling rate of the A/D converter. The pseudo random triangle was chosen because the repeat period of a shift register generator can be made extremely long with very few parts. That is, if necessary, the repeat period of the pseudo random triangle could be made much longer than the test time. A mathematical description of the effects of pseudo random triangle and fixed frequency triangle appears difficult to establish. Experimental results show that fixed frequency, pseudo random frequency, high frequency, and low frequency all give the same measurement values of differential linearity on the same A/D converter.

Because of the large number of output codes, it is difficult to appreciate a listing of the actual step sizes. For a 13 bit A/D converter, ther are $2^{13}=8192$ step sizes. A microprocessor program developed for the invention presents the data in several fashions.

First, it will print out a listing of all step sizes. Second, it will print out a graph of number of step sizes that fall within various windows. Therefore, at a glance, it can be determined how many step sizes are within ±0.1 quanta of ideal, how many are within ±0.1 quanta of a 0.8 quanta step and so on. Third, it will print out the DC location for all values in any step size window. A sample printout is shown below.

HISTOGRAM OF DIFFERENTIAL LINEARITY
ERROR       M = 300
   ERROR = (SAMPLES/LEVEL − 300) ÷ 300
   WINDOW VALUES
      WINDOW 00 = −1.0q to −0.9q ERROR
      WINDOW 05 = −0.1q to −0.1q ERROR
      WINDOW 43 =ERROR > 7. 5q
      (ALL OTHER WINDOWS 0. 2q WIDE)
HISTOGRAM SCALING   + = LESS THAN 64 COUNTS
                    * = 64/COUNTS/*
                    > = OVERFLOW

| WINDOW | | COUNTS |
|---|---|---|
| 00 | +........................................... | 0001 |
| 01 | .   .   .   .   .   .   .   .   .   .   . | 0000 |
| 02 | .   .   .   .   .   .   .   .   .   .   . | 0000 |
| 03 | +   .   .   .   .   .   .   .   .   .   . | 0023 |
| 04 | ********************   .   .   .   .   . | 1580 |
| 05 | >>>>>>>>>>>>>>>>>>>>>>>>>>>>>>> | 5047 |
| 06 | ********************   .   .   .   .   . | 1528 |
| 07 | +   .   .   .   .   .   .   .   .   .   . | 0013 |
| 08 | .   .   .   .   .   .   .   .   .   .   . | 0000 |
| 09 | .   .   .   .   .   .   .   .   .   .   . | 0000 |
| 10 | ........................................... | 0000 |
| 11 | .   .   .   .   .   .   .   .   .   .   . | 0000 |
| 12 | .   .   .   .   .   .   .   .   .   .   . | 0000 |
| 13 | .   .   .   .   .   .   .   .   .   .   . | 0000 |

```
                    -continued
HISTOGRAM OF DIFFERENTIAL LINEARITY
ERROR      M = 300
  ERROR = (SAMPLES/LEVEL − 300) ÷ 300
  WINDOW VALUES
     WINDOW 00 = −1.0q to −0.9q ERROR
     WINDOW 05 = −0.1q to −0.1q ERROR
     WINDOW 43 =ERROR > 7. 5q
  (ALL OTHER WINDOWS 0. 2q WIDE)
HISTOGRAM SCALING  + = LESS THAN 64 COUNTS
                   * = 64/COUNTS/*
                   > = OVERFLOW
WINDOW                                    COUNTS
 43  .   .   .   .   .   .   .   .   .  .    0000
```

Referring to the printout, line 4 indicates that 23 of the 8192 steps were between 0.5 and 0.7 quanta, and line 6 indicates that 5047 steps were 1±0.1 quanta.

The entire A/D converter characteristic need not be measured. If a smaller portion of the A/D characteristic needs intense measurement with higher accuracy, it can be done by reducing the triangle amplitude and shifting the converter DC to the proper value. To avoid the distortion on the triangle apexes, the triangle amplitude would be set larger than the range of the A/D converter to be examined and the microprocessor would consider conversions legitimate only if they fell within a chosen word range. For example, consider a 128 quanta section of the A/D converter to be examined rather than the 8192 q full scale. In the same amount of time as the full scale example, the number of samples, M, would be $(2^{13} \div 2^7) \times 1000 = 64000$. The probability that an actual 1 quanta step was measured to within an accuracy of ±2% is better than 99.9999%.

The prime novelty of the test method of the invention is that it provides accurate differential linearity measurements without the need for precision calibrated test equipment. Further, it can measure differential linearity with accuracies which are beyond the limitations of previously used test methods. Also, of secondary but significant importance, the test method embodies all of the following features: It requires only a simple easy-to-build triangle generator plus a microprocessor; the measurement is immune to noise on the input; the measurement is immune to offset drifts in the unit under test; the triangle waveform stimulus exercises the A/D converter dynamically at any of a variety of frequencies; the microprocessor printout provides an easy to read graph of number of occurrences (across the A/D) of various step sizes; and, the printout provides the size of each step and the DC locations of any step. The printout provides the DC locations of any step size.

While the invention has been described in one presently preferred embodiment it is understood that the words which have been used are words of description rather than words of limitation and that changes within the purview of the appended claims may be made without departing from the scope and spirit of the invention in its broader aspect.

What is claimed is:

1. The method of measuring the differential linearity of an analog/digital converter having an input and an output and a transfer characteristic represented by n coded steps, n being an integer, said method comprising the steps of generating a triangle waveform stimulus signal having a uniform amplitude probability density function and a pseudo random periodicity, the frequency of said triangle waveform stimulus signal having a relationship to the analog/digital sampling rate that permits equal sampling at all points along the analog/digital converter, said frequency being not less than 5 Hz nor more than 20 MHz, the repeat period of said pseudo random stimulus signal being substantially longer than the test period of said analog/digital converter, the amplitude of said triangle waveform stimulus signal being less than the analog/digital input signal voltage range, and the analog/digital converter D.C. being shifted to measure the linearity of a given portion of the analog/digital converter transfer characteristics, applying said signal to the input of said analog/digital converter, counting the number of times the output code word for each transfer characteristic step occurs, each step size being a function of the number of times its code word occurs, recording a list of all transfer characteristic step sizes, recording transfer characteristic step sizes that fall within discrete analog/digital converter step size windows, and recording D.C. locations for all values within any analog/digital step size window.

* * * * *